US012562212B2

(12) United States Patent
Usuda

(10) Patent No.: US 12,562,212 B2
(45) Date of Patent: Feb. 24, 2026

(54) SEMICONDUCTOR INTEGRATED CIRCUIT, SEMICONDUCTOR DEVICE, AND MEMORY SYSTEM

(71) Applicant: Kioxia Corporation, Tokyo (JP)

(72) Inventor: Masayuki Usuda, Tokyo (JP)

(73) Assignee: Kioxia Corporation, Tokyo (JP)

( * ) Notice: Subject to any disclaimer, the term of this patent is extended or adjusted under 35 U.S.C. 154(b) by 149 days.

(21) Appl. No.: 18/458,775

(22) Filed: Aug. 30, 2023

(65) Prior Publication Data

US 2024/0105252 A1     Mar. 28, 2024

(30) Foreign Application Priority Data

Sep. 22, 2022    (JP) ................................. 2022-151547

(51) Int. Cl.
*G11C 11/4074*       (2006.01)
*G05F 1/575*        (2006.01)
*G11C 5/14*        (2006.01)

(52) U.S. Cl.
CPC .......... *G11C 11/4074* (2013.01); *G05F 1/575* (2013.01); *G11C 5/147* (2013.01)

(58) Field of Classification Search
CPC .................................................. G11C 11/4074
See application file for complete search history.

(56) References Cited

U.S. PATENT DOCUMENTS

| | | | | |
|---|---|---|---|---|
| 10,216,209 B1 * | 2/2019 | Ham | .......................... | G05F 1/575 |
| 10,867,684 B1 * | 12/2020 | Piccardi | ................... | G11C 16/08 |
| 11,100,961 B2 * | 8/2021 | Yoshihara | ............... | G11C 16/30 |
| 11,302,400 B2 * | 4/2022 | Tsukamoto | ............ | G11C 5/145 |
| 2006/0267567 A1 | 11/2006 | Tanaka | | |
| 2008/0224675 A1 | 9/2008 | Takagi | | |
| 2013/0321076 A1 * | 12/2013 | Galbis | ........................ | H03F 3/24 |
| | | | | 323/284 |
| 2021/0303013 A1 * | 9/2021 | Sun | .......................... | G05F 1/575 |

(Continued)

FOREIGN PATENT DOCUMENTS

| | | |
|---|---|---|
| JP | 2006-338156 A | 12/2006 |
| JP | 2008-152690 A | 7/2008 |

(Continued)

OTHER PUBLICATIONS

Japanese Office Action mailed Jan. 20, 2026 in corresponding Japanese Patent Application 2022-151457 with English Translation, 6 pages.

*Primary Examiner* — Douglas King
(74) *Attorney, Agent, or Firm* — Kim & Stewart LLP

(57)     ABSTRACT

A semiconductor integrated circuit includes a first regulator configured to output a first output voltage at a predetermined level from a first output terminal, a second regulator configured to output a second output voltage at the predetermined level from a second output terminal connected to the first output terminal, and a control circuit. The control circuit is configured to turn on the second regulator and then turn off the first regulator such that the first and second regulators both remain on for a certain period of time when a regulator to be used is switched from the first regulator to the second regulator, and during the certain period of time, cause the second output voltage of the second regulator to be increased to a level higher than the predetermined level.

20 Claims, 10 Drawing Sheets

(56) References Cited

U.S. PATENT DOCUMENTS

| 2023/0078441 A1* | 3/2023 | Sumi | G11C 16/0483 |
| | | | 365/230.03 |
| 2023/0188038 A1* | 6/2023 | Finn | G11C 5/145 |

FOREIGN PATENT DOCUMENTS

| JP | 2010-224825 A | 10/2010 |
| JP | 2017-050902 A | 3/2017 |
| JP | 2020-036473 A | 3/2020 |

* cited by examiner

SEMICONDUCTOR INTEGRATED CIRCUIT, SEMICONDUCTOR DEVICE, AND MEMORY SYSTEM

CROSS-REFERENCE TO RELATED APPLICATION

This application is based upon and claims the benefit of priority from Japanese Patent Application No. 2022-151547, filed Sep. 22, 2022, the entire contents of which are incorporated herein by reference.

FIELD

Embodiments described herein relate generally to a semiconductor integrated circuit, a semiconductor device, and a memory system.

BACKGROUND

A semiconductor integrated circuit including a low power consumption regulator and a fast response regulator is known. In such a semiconductor integrated circuit, the low power consumption regulator or the fast response regulator is selectively and dynamically switched according to the purpose of use. When switching between the low power consumption regulator and the fast response regulator, an overlap period exists during which the two regulators operate simultaneously.

However, in the overlap period, the previously operating regulator may maintain an output voltage and the regulator that operates later may not function to maintain the output voltage. For that reason, when switching between the low power consumption regulator and the fast response regulator, the output voltage may drop significantly.

DETAILED DESCRIPTION

Embodiments provide a semiconductor integrated circuit, a semiconductor device, and a memory system that can switch between operations of two regulators without significantly dropping an output voltage.

In general, according to an embodiment, a semiconductor integrated circuit includes a first regulator configured to output a first output voltage at a predetermined level from a first output terminal, a second regulator configured to output a second output voltage at the predetermined level from a second output terminal connected to the first output terminal, and a control circuit. The control circuit is configured to turn on the second regulator and then turn off the first regulator such that the first and second regulators both remain on for a certain period of time when a regulator to be used is switched from the first regulator to the second regulator, and during the certain period of time, cause the second output voltage of the second regulator to be increased to a level higher than the predetermined level.

Embodiments will be described below with reference to the drawings.

First Embodiment

Configuration of Memory System

Figure 1:
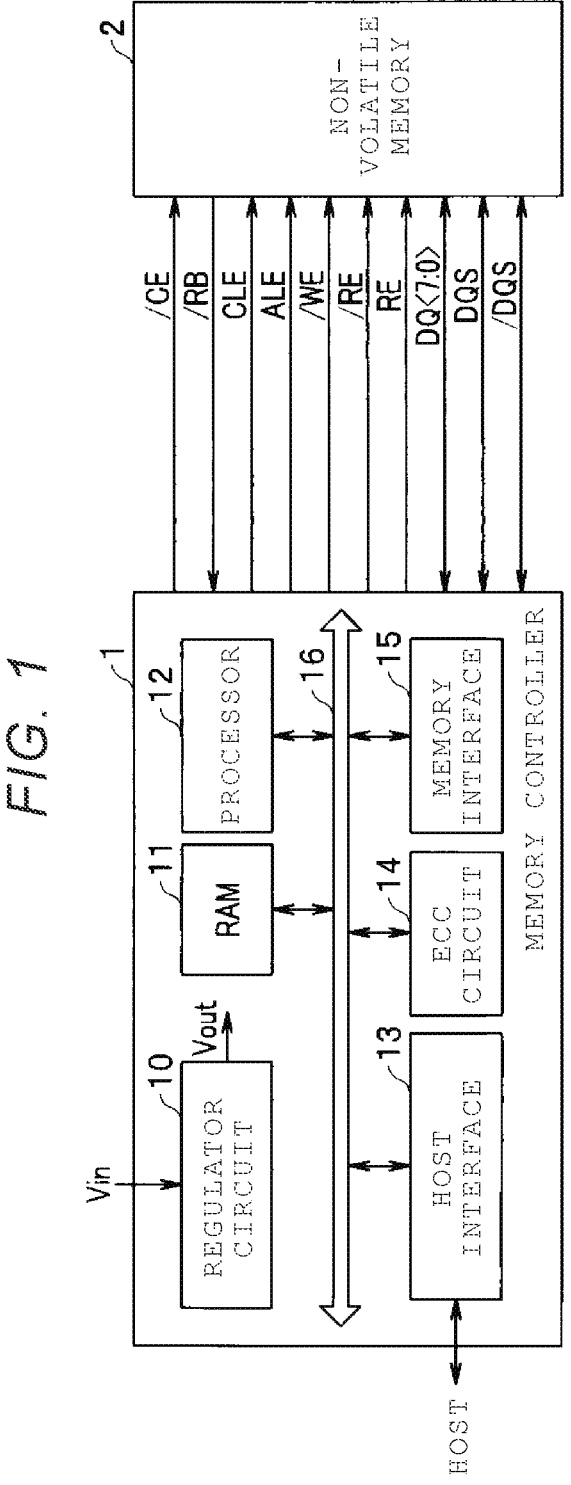
FIG. 1 is a block diagram illustrating a configuration example of a memory system according to a first embodiment.

FIG. 1 is a block diagram illustrating a configuration example of a memory system according to a first embodiment. The memory system according to the first embodiment includes a memory controller 1 and a non-volatile memory 2 as a semiconductor memory device. The memory system is connectable to a host. The host is, for example, an electronic device such as a personal computer or a mobile terminal.

The non-volatile memory 2 is a memory that stores data in a non-volatile manner. The non-volatile memory 2 is, for example, a NAND memory (NAND flash memory) having memory cells capable of storing 3 bits per memory cell, that is, a 3-bit/cell (TLC: Triple Level Cell) NAND memory. The non-volatile memory 2 may be a NAND memory capable of storing multiple bits of 1 bit/cell, 2 bits/cell, or 4 bits/cell or more. The non-volatile memory 2 is configured as one memory chip, for example. Alternatively, the non-volatile memory 2 may be configured with a plurality of memory chips. For example, the non-volatile memory 2 may be configured by bonding a chip including a memory cell array and a chip including peripheral circuits of the memory cell array.

The memory controller 1 controls writing of data to the non-volatile memory 2 according to a write request from the host. Also, the memory controller 1 controls reading of data from the non-volatile memory 2 according to a read request from the host. Between the memory controller 1 and the non-volatile memory 2, a chip enable signal /CE, a ready-busy signal /RB, a command latch enable signal CLE, an address latch enable signal ALE, a write enable signal /WE, read enable signals RE and /RE, a signal DQ<7:0> which is data, and data strobe signals DQS and /DQS are transmitted and received. It is noted that "/" appended to the signal name indicates active low.

For example, the non-volatile memory 2 and the memory controller 1 are each formed as a semiconductor chip (hereinafter also simply referred to as "chip").

The chip enable signal /CE is a signal for selecting and enabling a specific memory chip of the non-volatile memory 2. The ready-busy signal /RB is a signal indicating whether the non-volatile memory 2 is in a ready state (a state in which an external command can be accepted) or a busy state (a state in which the external command cannot be accepted). The command latch enable signal CLE is a signal indicating that the signal DQ<7:0> is a command. The command latch enable signal CLE enables commands transmitted as the signal DQ to be latched into command registers in selected memory chips of the non-volatile memory 2. The address latch enable signal ALE is a signal indicating that the signal DQ<7:0> is an address. The address latch enable signal ALE enables addresses transmitted as the signal DQ to be latched into address registers in selected memory chips of the non-volatile memory 2. The write enable signal /WE is a signal for taking the received signal into the non-volatile memory 2 and is asserted each time the memory controller 1 receives a command and an address. The non-volatile memory 2 is instructed to take in the signal DQ<7:0> that indicated the command or address at the timing of the edge of the write enable signal /WE.

The read enable signals RE and /RE are signals for the memory controller 1 to read data from the non-volatile memory 2. The read enable signals RE and /RE are used, for example, to control the operation timing of the non-volatile memory 2 when the signal DQ<7:0> is output. The signal DQ<7:0> is data transmitted and received between the non-volatile memory 2 and the memory controller 1, and includes the command, the address, and the data. The data strobe signals DQS and /DQS are signals for controlling input and output timings of the signal DQ<7:0>.

The memory controller 1 includes a regulator circuit 10, a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected to each other via an internal bus 16.

The regulator circuit 10 regulates an input voltage Vin input from the outside of the memory controller 1 to an output voltage Vout. The regulator circuit 10 regulates, for example, an input voltage Vin of 1.2 V to an output voltage Vout of 0.8 V and supplies the regulated output voltage Vout to each block in the memory controller 1. The regulator circuit 10 may regulate one or more output voltages other than the output voltage Vout of 0.8V. The RAM 11, the processor 12, the host interface 13, the ECC circuit 14, and the memory interface 15 are examples of a load circuit that operates with the output voltage Vout output from the regulator circuit 10. Although the regulator circuit 10 is provided in the memory controller 1, the present disclosure is not limited thereto, and the regulator circuit 10 may be provided in the non-volatile memory 2 or another semiconductor device.

The host interface 13 outputs a request, user data (write data), and the like received from the host, to the internal bus 16. Further, the host interface 13 also transmits user data read from the non-volatile memory 2, a response from the processor 12, and the like to the host.

The memory interface 15 controls the process of writing user data and the like to the non-volatile memory 2 and the process of reading user data and the like from the non-volatile memory 2 based on the instruction from the processor 12.

The processor 12 comprehensively controls the memory controller 1. The processor 12 is, for example, a central processing unit (CPU), a micro processing unit (MPU), or the like. When receiving the request from the host via the host interface 13, the processor 12 performs control according to the request. For example, the processor 12 instructs the memory interface 15 to write user data and parity to the non-volatile memory 2 according to the request from the host. The processor 12 also instructs the memory interface 15 to read user data and parity from the non-volatile memory 2 according to the request from the host.

The ECC circuit 14 encodes the user data stored in the RAM 11 to generate code words. In addition, the ECC circuit 14 decodes the code words read from the non-volatile memory 2.

The RAM 11 temporarily stores user data received from the host until the user data is stored into the non-volatile memory 2, and temporarily stores data read from the non-volatile memory 2 until the data is transmitted to the host. The RAM 11 is, for example, a general-purpose memory such as a static random access memory (SRAM) or a dynamic random access memory (DRAM).

FIG. 1 illustrates a configuration example in which the memory controller 1 includes the ECC circuit 14 and the memory interface 15, respectively. Alternatively, the ECC circuit 14 may be incorporated in the memory interface 15. Also, the ECC circuit 14 may be incorporated in the non-volatile memory 2.

Configuration of Regulator Circuit

Figure 2:
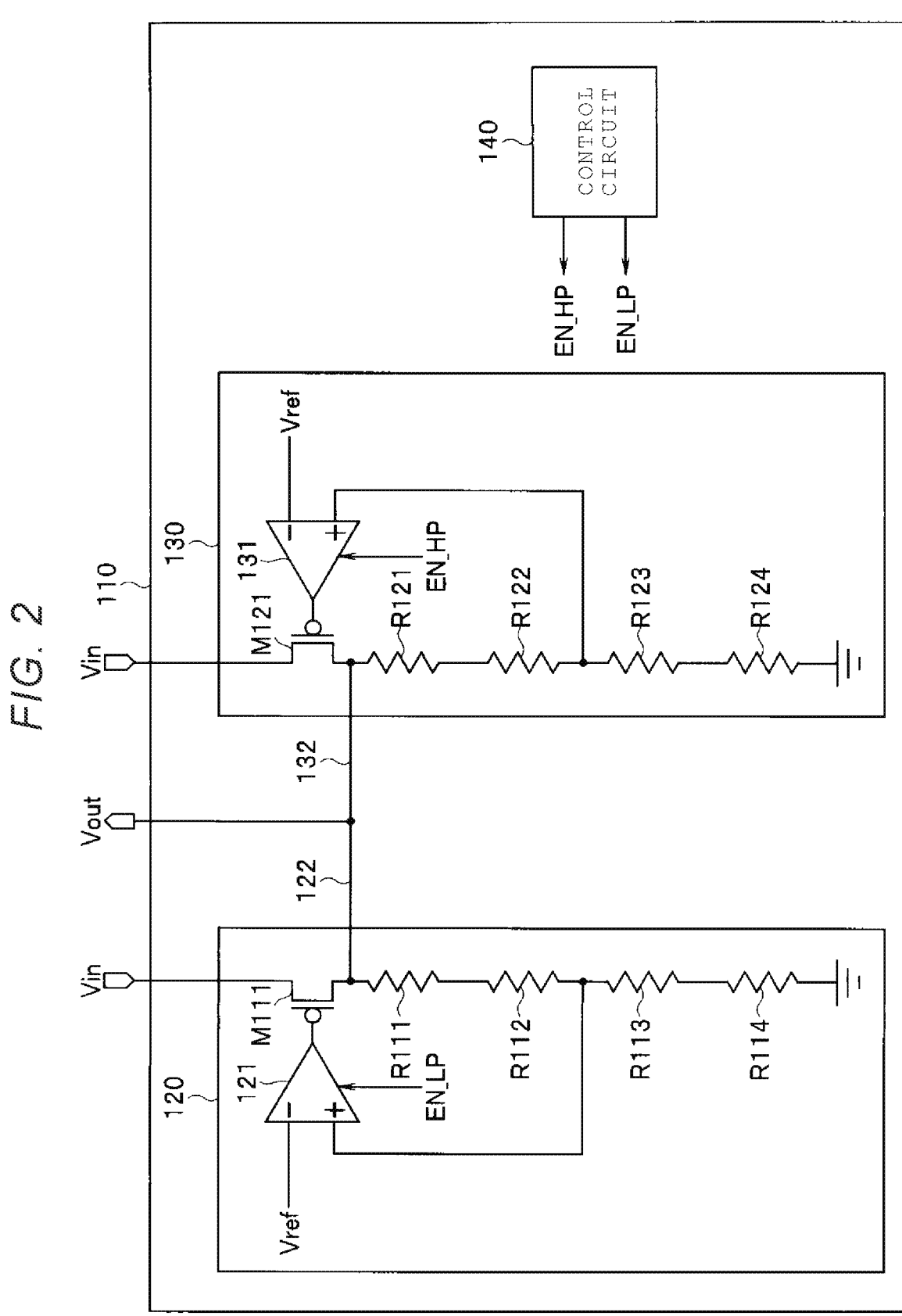
FIG. 2 is a circuit diagram illustrating an example of a configuration of a regulator circuit according to a comparative example.

Next, a configuration of a regulator circuit will be described. Before describing a configuration of the regulator circuit 10 according to the present embodiment, a configuration of a regulator circuit according to a comparative example will be described. FIG. 2 is a circuit diagram illustrating an example of the configuration of the regulator circuit according to the comparative example.

As illustrated in FIG. 2, a regulator circuit 110 according to the comparative example includes a low power consumption regulator 120, a fast response regulator 130, and a control circuit 140. The low power consumption regulator 120 has a transistor of which size is smaller than that of a transistor of the fast response regulator 130 and has the characteristic of operating with lower power consumption than the fast response regulator 130. For example, the low power consumption regulator 120 is turned on in a period of time during which the memory controller 1 is not performing a write operation or the like to the non-volatile memory 2. The fast response regulator 130 has a transistor of which size is larger than that of the transistor of the low power consumption regulator 120 and has the characteristic of responding faster than the low power consumption regulator 120. For example, the fast response regulator 130 is turned on in a period of time during which the memory controller 1 is performing the write operation or the like to the non-volatile memory 2. An output terminal 122 of the low power consumption regulator 120 and an output terminal 132 of the fast response regulator 130 are connected to each other.

The low power consumption regulator 120 includes an amplifier 121, a PMOS transistor M111, and resistors R111, R112, R113, and R114.

The fast response regulator 130 includes an amplifier 131, a PMOS transistor M121, and resistors R121, R122, R123, and R124.

The PMOS transistor M111 includes a source terminal to which the input voltage Vin is input, a gate terminal to which a control signal is input, and a drain terminal from which the output voltage Vout is output.

The resistors R111, R112, R113, and R114 are connected in series between the drain terminal of the PMOS transistor M111 and ground. The resistors R111, R112, R113, and R114 are employed to divide the output voltage Vout. Specifically, a feedback voltage obtained by dividing the output voltage Vout is output to the amplifier 121 from a connection point (may be referred to as node) between the resistors R112 and R113.

In the amplifier 121, a reference voltage Vref is supplied to an inverting input terminal thereof and the feedback voltage is supplied to a non-inverting input terminal thereof. The amplifier 121 outputs the control signal corresponding to a difference between the reference voltage Vref and the feedback voltage to the gate terminal of the PMOS transistor M111. The amplifier 121 controls the control signal so that the feedback voltage becomes equal to the reference voltage Vref. As a result, the substantially constant output voltage Vout is output from the drain terminal of the PMOS transistor M111.

The PMOS transistor M121 includes a source terminal to which the input voltage Vin is input, a gate terminal to which a control signal is input, and a drain terminal from which the output voltage Vout is output.

The resistors R121, R122, R123, and R124 are connected in series between the drain terminal of the PMOS transistor M121 and the ground. The resistors R121, R122, R123, and R124 are employed to divide the output voltage Vout. Specifically, a feedback voltage obtained by dividing the output voltage Vout is output to the amplifier 131 from a connection point (may be referred to as node) between the resistors R122 and R123.

In the amplifier 131, the reference voltage Vref is supplied to an inverting input terminal thereof and the feedback voltage is supplied to a non-inverting input terminal thereof. The amplifier 131 outputs the control signal corresponding to a difference between the reference voltage Vref and the feedback voltage to the gate terminal of the PMOS transistor M121. The amplifier 131 controls the control signal so that the feedback voltage becomes equal to the reference voltage Vref. As a result, the substantially constant output voltage Vout is output from the drain terminal of the PMOS transistor M121.

The control circuit 140 outputs a control signal EN_LP for controlling ON or OFF of the low power consumption regulator 120 to the amplifier 121. The control circuit 140 outputs a control signal EN_HP for controlling ON or OFF of the fast response regulator 130 to the amplifier 131. As a result, the control circuit 140 switches between the low power consumption regulator 120 and the fast response regulator 130 to operate (turn on).

The amplifier 121 of the low power consumption regulator 120 operates when a high-level control signal EN_LP is input and stops operating when a low-level control signal EN_LP is input. Similarly, the amplifier 131 of the fast response regulator 130 operates when a high-level control signal EN_HP is input and stops operating when a low-level control signal EN_HP is input.

Therefore, when operating the low power consumption regulator 120, the control circuit 140 outputs the high-level control signal EN_LP to the amplifier 121 and outputs the low-level control signal EN_HP to the amplifier 131. Meanwhile, when operating the fast response regulator 130, the control circuit 140 outputs the low-level control signal EN_LP to the amplifier 121 and outputs the high-level control signal EN_HP to the amplifier 131.

Figure 3:
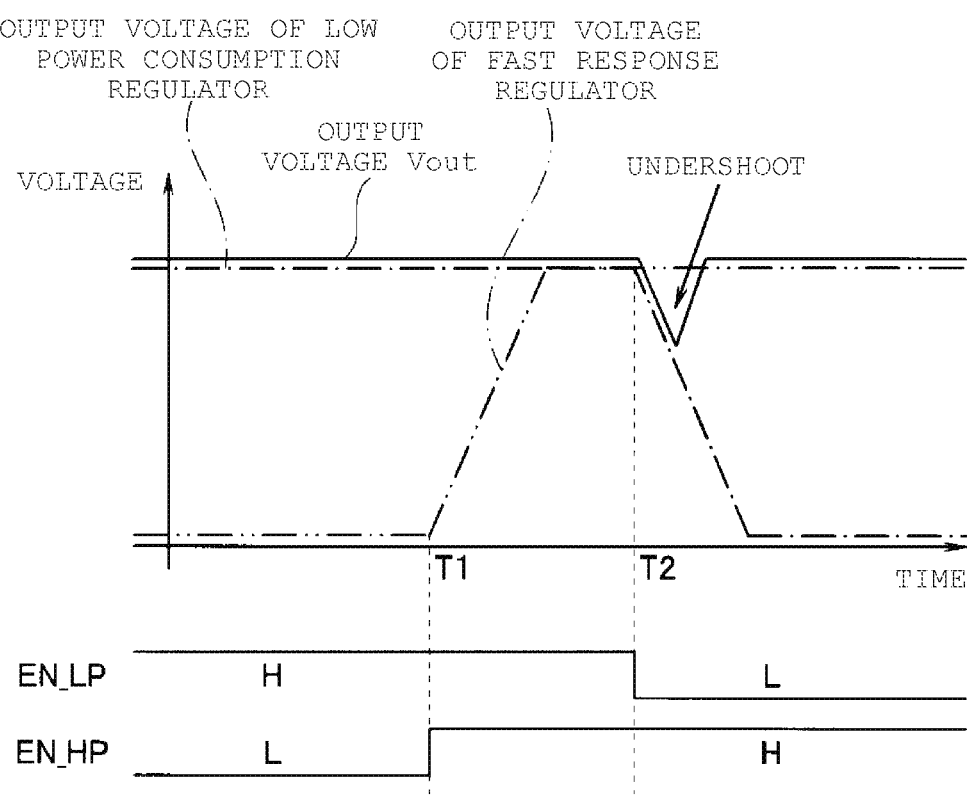
FIG. 3 is a timing chart illustrating a switching operation in the regulator circuit according to the comparative example.

FIG. 3 is a timing chart illustrating a switching operation in the regulator circuit according to the comparative example. FIG. 3 illustrates the operation of switching from the low power consumption regulator 120 to the fast response regulator 130.

In the period of time before time T1, while the low power consumption regulator 120 is operating, the control signal EN_LP is at a high level and the control signal EN_HP is at a low level. When switching from the low power consumption regulator 120 to the fast response regulator 130, the control circuit 140 raises the control signal EN_HP to a high level at time T1. As a result, the amplifier 131 starts operating, and the output voltage of the fast response regulator 130 rises. After time T1, the control signal EN_LP maintains the high level.

Subsequently, the control circuit 140 causes the control signal EN_LP to fall to a low level at time T2. As a result, the amplifier 121 stops operating and the output voltage of the low power consumption regulator 120 falls.

Thus, when switching between the two regulators (the low power consumption regulator 120 and the fast response regulator 130), an overlap period during which the low power consumption regulator 120 and the fast response regulator 130 are operating simultaneously prevents the output voltage Vout from dropping. The overlap period is a period of time during which the two regulators are turned on simultaneously when switching between the low power consumption regulator 120 and the fast response regulator 130, that is, a period of time from time T1 to time T2.

However, in the overlap period during which the low power consumption regulator 120 and the fast response regulator 130 are operating simultaneously, the previously operating regulator (i.e., the low power consumption regulator 120 in an example of FIG. 3) may maintain the output voltage Vout, and the regulator that operates later (i.e., the fast response regulator 130 in the example of FIG. 3) is turned on but may not function to maintain the output voltage Vout.

As a result, when the low power consumption regulator 120 that is operating previously is turned off, the fast response regulator 130 that operates later cannot respond immediately, causing an undershoot in the output voltage Vout and a large drop in the output voltage Vout.

Figure 4:
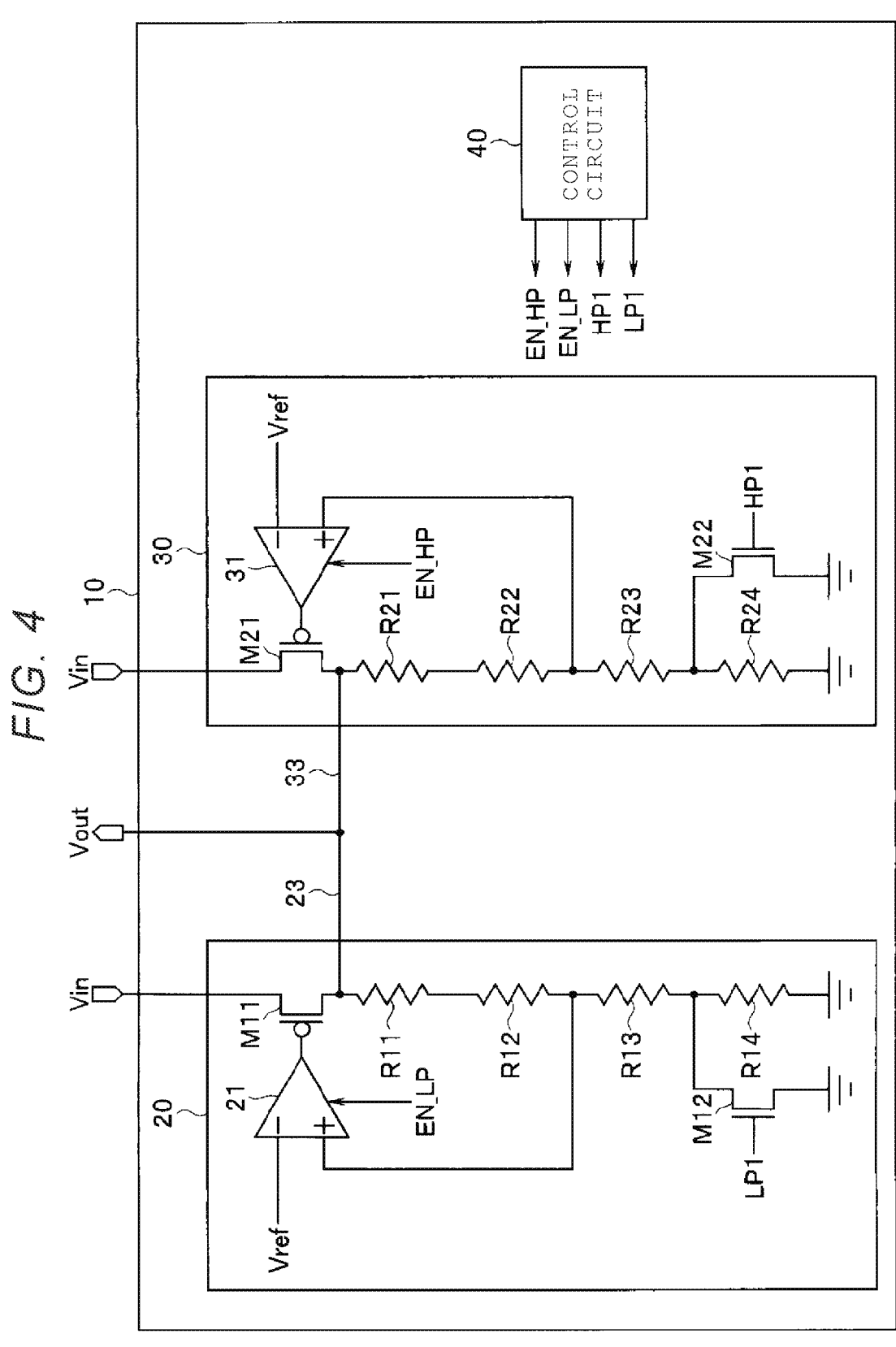
FIG. 4 is a circuit diagram illustrating an example of a configuration of a regulator circuit according to the first embodiment.

In contrast, the regulator circuit 10 according to the present embodiment switches between the two regulators without a large drop in the output voltage Vout. FIG. 4 is a circuit diagram illustrating an example of a configuration of a regulator circuit according to the first embodiment.

The regulator circuit 10 according to the first embodiment includes a low power consumption regulator 20, a fast response regulator 30, and a control circuit 40. The low power consumption regulator 20 has a transistor of which size is smaller than that of a transistor of the fast response regulator 30 and has the characteristic of operating with lower power consumption than the fast response regulator 30. For example, the low power consumption regulator 20 is turned on in the period of time during which the memory controller 1 is not performing the write operation or the like to the non-volatile memory 2. The fast response regulator 30 has a transistor of which size is larger than that of the transistor of the low power consumption regulator 20 and has the characteristic of responding faster than the low power consumption regulator 20. For example, the fast response regulator 30 is turned on in the period of time during which the memory controller 1 is performing the write operation or the like to the non-volatile memory 2. An output terminal 23 of the low power consumption regulator 20 and an output terminal 33 of the fast response regulator 30 are connected to each other. The regulator circuit 10 switches between the low power consumption regulator 20 and the fast response regulator 30 to operate, for example, according to the operation mode or the like. The low power consumption regulator 20 and the fast response regulator 30 are examples of a first regulator and a second regulator, respectively. The regulator circuit 10 is an example of a semiconductor integrated circuit.

The low power consumption regulator 20 includes an amplifier 21, a PMOS transistor M11, an NMOS transistor M12, and resistors R11, R12, R13, and R14.

The fast response regulator 30 includes an amplifier 31, a PMOS transistor M21, an NMOS transistor M22, and resistors R21, R22, R23 and R24.

First, the configuration of the low power consumption regulator 20 will be described. The PMOS transistor M11 has a source terminal to which the input voltage Vin is input, a gate terminal to which a control signal is input, and a drain terminal from which the output voltage Vout is output. The PMOS transistor M11 is an example of a first transistor.

The resistors R11, R12, R13, and R14 are connected in series between the drain terminal of the PMOS transistor M11 and the ground. The resistors R11, R12, R13, and R14 divide the output voltage Vout. Specifically, a feedback voltage obtained by dividing the output voltage Vout is output to the amplifier 21 from a connection point between the resistors R12 and R13. The resistors R11, R12, R13, and R14 are examples of a first feedback resistor circuit.

In the amplifier 21, a reference voltage Vref is supplied to an inverting input terminal thereof and the feedback voltage is supplied to a non-inverting input terminal thereof. The amplifier 21 outputs the control signal corresponding to a difference between the reference voltage Vref and the feedback voltage to the gate terminal of the PMOS transistor M11. The amplifier 21 controls the control signal so that the feedback voltage becomes equal to the reference voltage Vref. As a result, the substantially constant output voltage Vout is output from the drain terminal of the PMOS transistor M11. The amplifier 21 is an example of a first amplifier.

The NMOS transistor M12 is connected in parallel to the resistor R14 among the resistors R11, R12, R13, and R14 that configure the first feedback resistor circuit. The NMOS transistor M12 includes a drain terminal connected to a connection point between the resistors R13 and R14, a gate terminal to which a control signal LP1 is input, and a source terminal connected to the ground. The NMOS transistor M12 is an example of a second transistor.

Next, the configuration of the fast response regulator 30 will be described. The PMOS transistor M21 includes a source terminal to which the input voltage Vin is input, a gate terminal to which a control signal is input, and a drain terminal from which the output voltage Vout is output. The PMOS transistor M21 is an example of a third transistor.

The resistors R21, R22, R23, and R24 are connected in series between the drain terminal of the PMOS transistor M21 and the ground. The resistors R21, R22, R23, and R24 divide the output voltage Vout. Specifically, a feedback voltage obtained by dividing the output voltage Vout is output to the amplifier 31 from a connection point between the resistors R22 and R23. The resistors R21, R22, R23, and R24 are examples of a second feedback resistor circuit.

In the amplifier 31, a reference voltage Vref is supplied to an inverting input terminal thereof and the feedback voltage is supplied to a non-inverting input terminal thereof. The amplifier 31 outputs the control signal corresponding to a difference between the reference voltage Vref and the feedback voltage to the gate terminal of the PMOS transistor M21. The amplifier 31 controls the control signal so that the feedback voltage becomes equal to the reference voltage Vref. As a result, the substantially constant output voltage Vout is output from the drain terminal of the PMOS transistor M21. The amplifier 31 is an example of a second amplifier.

The NMOS transistor M22 is connected in parallel to the resistor R24 among the resistors R21, R22, R23, and R24 that configure the second feedback resistor circuit. The NMOS transistor M22 includes a drain terminal connected to a connection point between the resistors R23 and R24, a gate terminal to which a control signal HP1 is input, and a source terminal connected to the ground. The NMOS transistor M22 is an example of a fourth transistor.

The control circuit 40 outputs a control signal EN_LP for controlling ON or OFF of the low power consumption regulator 20 to the amplifier 21. The control circuit 40 outputs a control signal EN_HP for controlling ON or OFF of the fast response regulator 30 to the amplifier 31. As a result, the control circuit 40 switches between the low power consumption regulator 20 and the fast response regulator 30 to operate.

The amplifier 21 of the low power consumption regulator 20 operates when a high-level control signal EN_LP is input and stops operating when a low-level control signal EN_LP is input. Similarly, the amplifier 31 of the fast response regulator 30 operates when a high-level control signal EN_HP is input and stops operating when a low-level control signal EN_HP is input.

Therefore, when operating the low power consumption regulator 20, the control circuit 40 outputs the high-level control signal EN_LP to the amplifier 21 and outputs the low-level control signal EN_HP to the amplifier 31. Meanwhile, when operating the fast response regulator 30, the control circuit 40 outputs the low-level control signal EN_LP to the amplifier 21 and outputs the high-level control signal EN_HP to the amplifier 31.

In addition, the control circuit 40 outputs the control signal LP1 for controlling ON or OFF of the NMOS transistor M12 to the NMOS transistor M12. The control circuit 40 outputs the control signal HP1 for controlling ON or OFF of the NMOS transistor M22 to the NMOS transistor M22. The NMOS transistor M12 is turned off when a low-level control signal LP1 is input and turned on when a high-level control signal LP1 is input. Similarly, the NMOS transistor M22 is turned off when a low-level control signal HP1 is input and turned on when a high-level control signal HP1 is input.

The control circuit 40 outputs the control signals LP1 and HP1 to turn on one of the NMOS transistors M12 and M22 in an overlap period when switching between the two regulators, that is, the low power consumption regulator 20 and the fast response regulator 30. The overlap period is a period of time during which the two regulators are turned on simultaneously when switching between the low power consumption regulator 20 and the fast response regulator 30.

Specifically, the control circuit 40 outputs the high-level control signal HP1 to the NMOS transistor M22 in an overlap period when switching from the low power consumption regulator 20 to the fast response regulator 30. The control circuit 40 outputs the low-level control signal HP1 to the NMOS transistor M22 in a period of time except for the overlap period when switching from the low power consumption regulator 20 to the fast response regulator 30. When switching from the low power consumption regulator 20 to the fast response regulator 30, the control circuit 40 continues to output the low-level control signal LP1 to the NMOS transistor M12.

Meanwhile, the control circuit 40 outputs the high-level control signal LP1 to the NMOS transistor M12 in an overlap period when switching from the fast response regulator 30 to the low power consumption regulator 20. The control circuit 40 outputs the low-level control signal LP1 to the NMOS transistor M12 in a period of time except for the overlap period when switching from the fast response regulator 30 to the low power consumption regulator 20. When switching from the fast response regulator 30 to the low power consumption regulator 20, the control circuit 40 continues to output the low-level control signal HP1 to the NMOS transistor M22.

Figure 5:
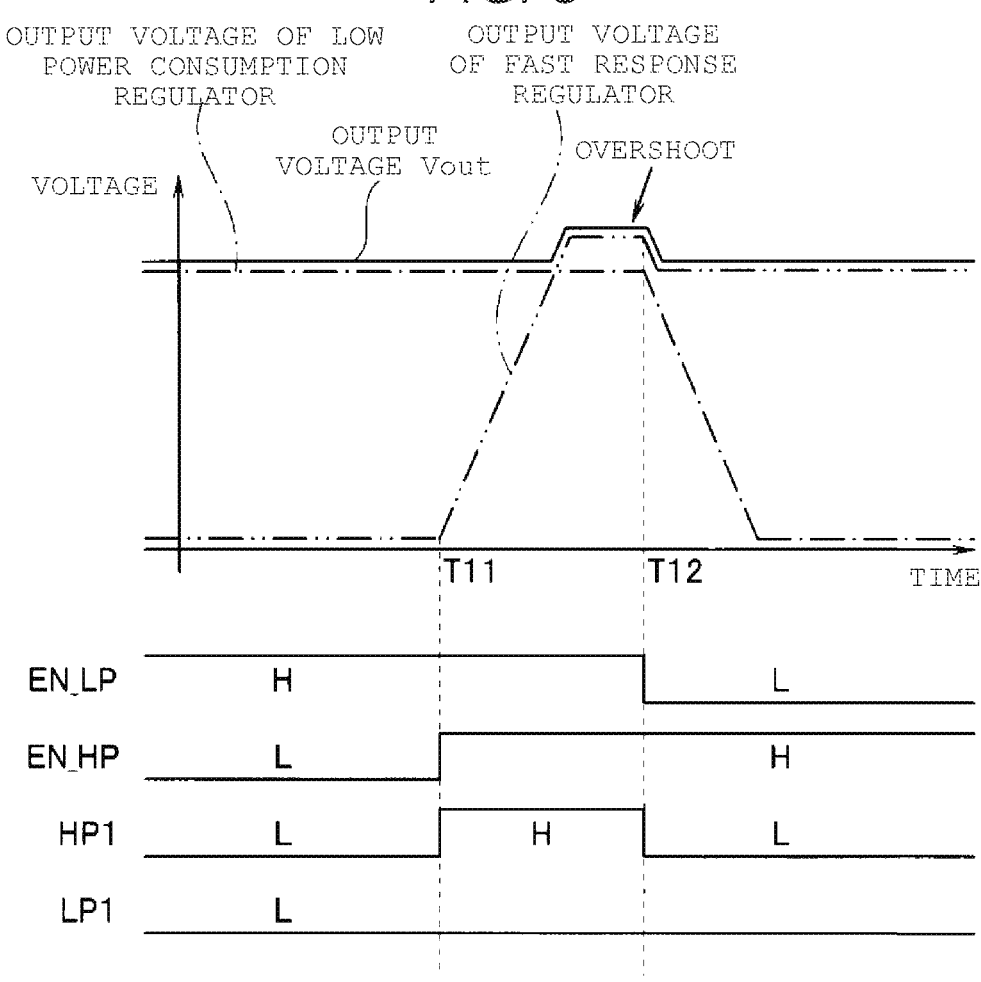
FIG. 5 is a timing chart illustrating a switching operation in the regulator circuit according to the first embodiment.

FIG. 5 is a timing chart illustrating a switching operation in the regulator circuit according to the first embodiment. In FIG. 5, the operation of switching from the low power consumption regulator 20 to the fast response regulator 30 will be described.

In a period of time before time T11, the control circuit 40 outputs the high-level control signal EN_LP and the low-level control signal EN_HP. As a result, the low power consumption regulator 20 is turned on and the fast response regulator 30 is turned off. Also, in the period of time before time T11, the control circuit 40 outputs the low-level control signal LP1 and the low-level control signal HP1. As a result, both the NMOS transistors M12 and M22 are turned off. When switching from the low power consumption regulator 20 to the fast response regulator 30, the control circuit 40 raises the control signal EN_HP to a high level at time T11. As a result, the amplifier 31 starts operating, and an output voltage of the fast response regulator 30 rises.

Subsequently, the control circuit 40 causes the control signal EN_LP to fall to a low level at time T12. As a result, the amplifier 21 stops operating and an output voltage of the low power consumption regulator 20 falls.

Further, the control circuit 40 raises the control signal HP1 to a high level in an overlap period during which the low power consumption regulator 20 and the fast response regulator 30 operate simultaneously, specifically, in a period of time from time T11 to time T12. When the high-level control signal HP1 is input to the gate terminal of the NMOS transistor M22, the NMOS transistor M22 is turned on, which causes the resistor R24 configuring a part of the second feedback resistor circuit to be short-circuited.

By causing the resistor R24 configuring a part of the second feedback resistor circuit to be short-circuited, the feedback voltage output from the connection point between the resistors R22 and R23 is lowered than when the resistor R24 is not short-circuited. As a result, the amplifier 31 outputs a control signal for increasing the output voltage Vout to the gate terminal of the PMOS transistor M21.

As a result, an overshoot occurs in the output voltage of the fast response regulator 30 in the period of time from time T11 to time T12, and the output voltage Vout can be temporarily increased. As a result, in the overlap period during which the low power consumption regulator 20 and the fast response regulator 30 operate simultaneously, the fast response regulator 30 with a high output voltage always maintains the output voltage Vout or higher. As a result, when the low power consumption regulator 20 that is operating previously is turned off, the low power consumption regulator 20 can be switched to the fast response regulator 30 without causing an undershoot in the output voltage Vout.

Meanwhile, when switching from the fast response regulator 30 to the low power consumption regulator 20, the control circuit 40 raises the control signal LP1 to a high level in the overlap period during which the low power consumption regulator 20 and the fast response regulator 30 operate simultaneously. When the high-level control signal LP1 is input to the gate terminal of the NMOS transistor M12, the NMOS transistor M12 is turned on, which causes the resistor R14 configuring a part of the first feedback resistor circuit to be short-circuited.

By causing the resistor R14 configuring the part of the first feedback resistor circuit to be short-circuited, the feedback voltage output from the connection point between the resistors R12 and R13 is lowered than when the resistor R14 is not short-circuited. Therefore, the amplifier 21 outputs a control signal for increasing the output voltage Vout to the gate terminal of the PMOS transistor M11.

As a result, an overshoot occurs in the output voltage of the low power consumption regulator 20 in the overlap period during which the fast response regulator 30 and the low power consumption regulator 20 operate simultaneously, and the output voltage Vout can be temporarily increased. As a result, when the fast response regulator 30 that is operating previously is turned off, the fast response regulator 30 can be switched to the low power consumption regulator 20 without causing an undershoot in the output voltage Vout.

As described above, the regulator circuit 10 according to the first embodiment causes an overshoot in the output voltage of the regulator that operates later in the overlap period during which the low power consumption regulator 20 and the fast response regulator 30 operate simultaneously so that the regulator that operates later maintains the output voltage Vout or higher. As a result, when switching between the low power consumption regulator 20 and the fast response regulator 30, the regulator circuit 10 does not cause an undershoot in the output voltage Vout when the previously operating regulator is turned off.

Therefore, the regulator circuit 10 can switch between the low power consumption regulator 20 and the fast response regulator 30 without significantly dropping the output voltage Vout.

Modification

Next, a modification will be described.

The regulator circuit 10 according to the first embodiment temporarily increases the output voltage Vout of the regulator that operates later by causing a resistor configuring a part of the feedback resistor circuit to be short-circuited in the overlap period.

Meanwhile, a regulator circuit 10A according to the modification temporarily increases the output voltage Vout of the regulator that operates later by changing a node of the feedback resistor circuit from which the feedback voltage is output in the overlap period.

Figure 6:
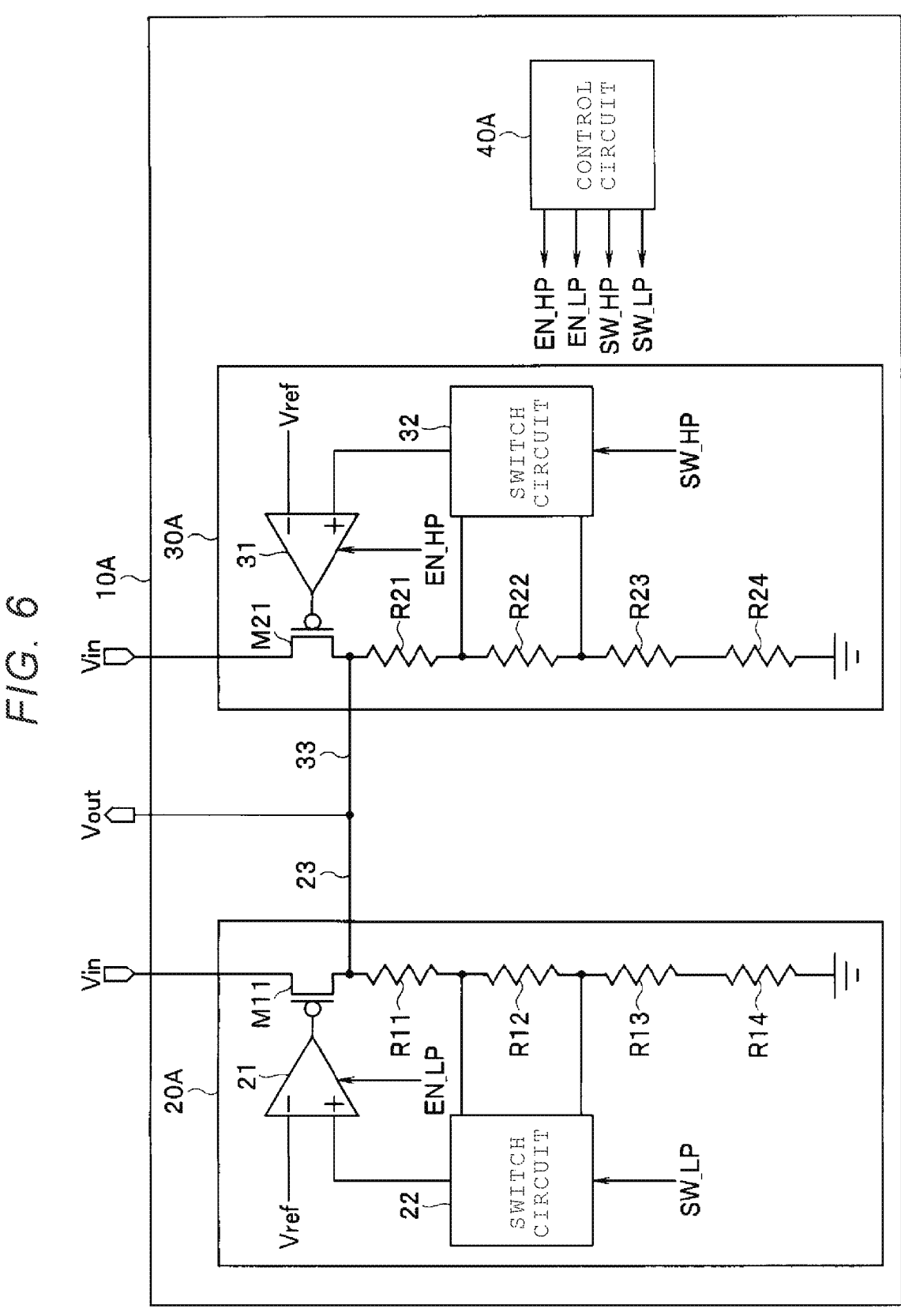
FIG. 6 is a circuit diagram illustrating an example of a configuration of a regulator circuit according to a modification.

FIG. 6 is a circuit diagram illustrating an example of a configuration of a regulator circuit according to the modification. In FIG. 6, the same configurations as in FIG. 4 are given the same reference numerals, and descriptions thereof are omitted.

The regulator circuit 10A according to the modification includes a low power consumption regulator 20A, a fast response regulator 30A, and a control circuit 40A. The output terminal 23 of the low power consumption regulator 20A and the output terminal 33 of the fast response regulator 30A are connected to each other.

In the low power consumption regulator 20A, the NMOS transistor M12 is removed from the low power consumption regulator 20 of FIG. 4, and a switching circuit 22 is added.

In the fast response regulator 30A, the NMOS transistor M22 is removed from the fast response regulator 30 of FIG. 4, and a switching circuit 32 is added.

A feedback voltage from a connection point between the resistors R11 and R12 and a feedback voltage from the connection point between the resistors R12 and R13 are input to the switching circuit 22. Based on a switching control signal SW LP from the control circuit 40A, the switching circuit 22 outputs one of the feedback voltage from the connection point between the resistors R11 and R12 and the feedback voltage from the connection point between the resistors R12 and R13 to a non-inverting input terminal of the amplifier 21. The switching circuit 22 is an example of a first switching circuit.

A feedback voltage from a connection point between the resistors R21 and R22 and a feedback voltage from the connection point between the resistors R22 and R23 are input to the switching circuit 32. Based on a switching control signal SW HP from the control circuit 40A, the switching circuit 32 outputs one of the feedback voltage from the connection point between the resistors R21 and R22 and the feedback voltage from the connection point between the resistors R22 and R23 to a non-inverting input terminal of the amplifier 31. The switching circuit 32 is an example of a second switching circuit.

The control circuit 40A outputs the switching control signals SW LP and SW HP for switching connection destinations to the switching circuits 22 and 32, respectively.

Specifically, the control circuit 40A controls the switching circuit 32 so that the connection point between the resistor R22 and the resistor R23 is connected to the non-inverting input terminal of the amplifier 31 in an overlap period when switching from the low power consumption regulator 20A to the fast response regulator 30A. The control circuit 40A controls the switching circuit 32 so that the connection point between the resistors R21 and R22 is connected to the non-inverting input terminal of the amplifier 31 in a period of time except for the overlap period when switching from the low power consumption regulator 20A to the fast response regulator 30A.

Meanwhile, the control circuit 40A controls the switching circuit 22 so that the connection point between the resistors R12 and R13 is connected to the non-inverting input terminal of the amplifier 21 in an overlap period when switching from the fast response regulator 30A to the low power consumption regulator 20A. The control circuit 40A controls the switching circuit 22 so that the connection point between the resistors R11 and R12 is connected to the non-inverting input terminal of the amplifier 21 in a period of time except for the overlap period when switching from the fast response regulator 30A to the low power consumption regulator 20A.

As described above, when switching from the low power consumption regulator 20A to the fast response regulator 30A, the feedback voltage from the connection point between the resistors R21 and R22 is input to the non-inverting input terminal of the amplifier 31 in the period of time except for the overlap period. In the overlap period, the feedback voltage from the connection point between the resistors R22 and R23 is input to the non-inverting input terminal of the amplifier 31. As a result, the feedback voltage input to the non-inverting input terminal of the amplifier 31 is temporarily lowered in the overlap period. Therefore, the amplifier 31 outputs a control signal for increasing the output voltage Vout to the gate terminal of the PMOS transistor M21.

As a result, as in the above-described embodiment, an overshoot occurs in the output voltage Vout of the fast response regulator 30, and the output voltage Vout can be temporarily increased. As a result, in the overlap period during which the low power consumption regulator 20 and the fast response regulator 30 operate simultaneously, the fast response regulator 30 with a higher output, always maintains the output voltage Vout or higher.

Therefore, as in the above-described embodiment, when the low power consumption regulator 20 is switched to the fast response regulator 30 and the low power consumption regulator 20 is turned off, it is possible to switch from the low power consumption regulator 20 to the fast response regulator 30 without causing an undershoot in the output voltage Vout.

The method of temporarily increasing the output voltage Vout of the regulator that operates later is not limited to changing the position where the feedback voltage is output in the feedback resistor circuit. For example, by making it possible to change an offset to the inverting input terminal or the non-inverting input terminal of the amplifiers 21 and 31 and changing the offset to the inverting input terminal or the non-inverting input terminal of the amplifier 21 or 31 in the overlap period, the output voltage Vout of the regulator that operates later may be temporarily increased.

Second Embodiment

Next, a second embodiment is described.

Figure 7:
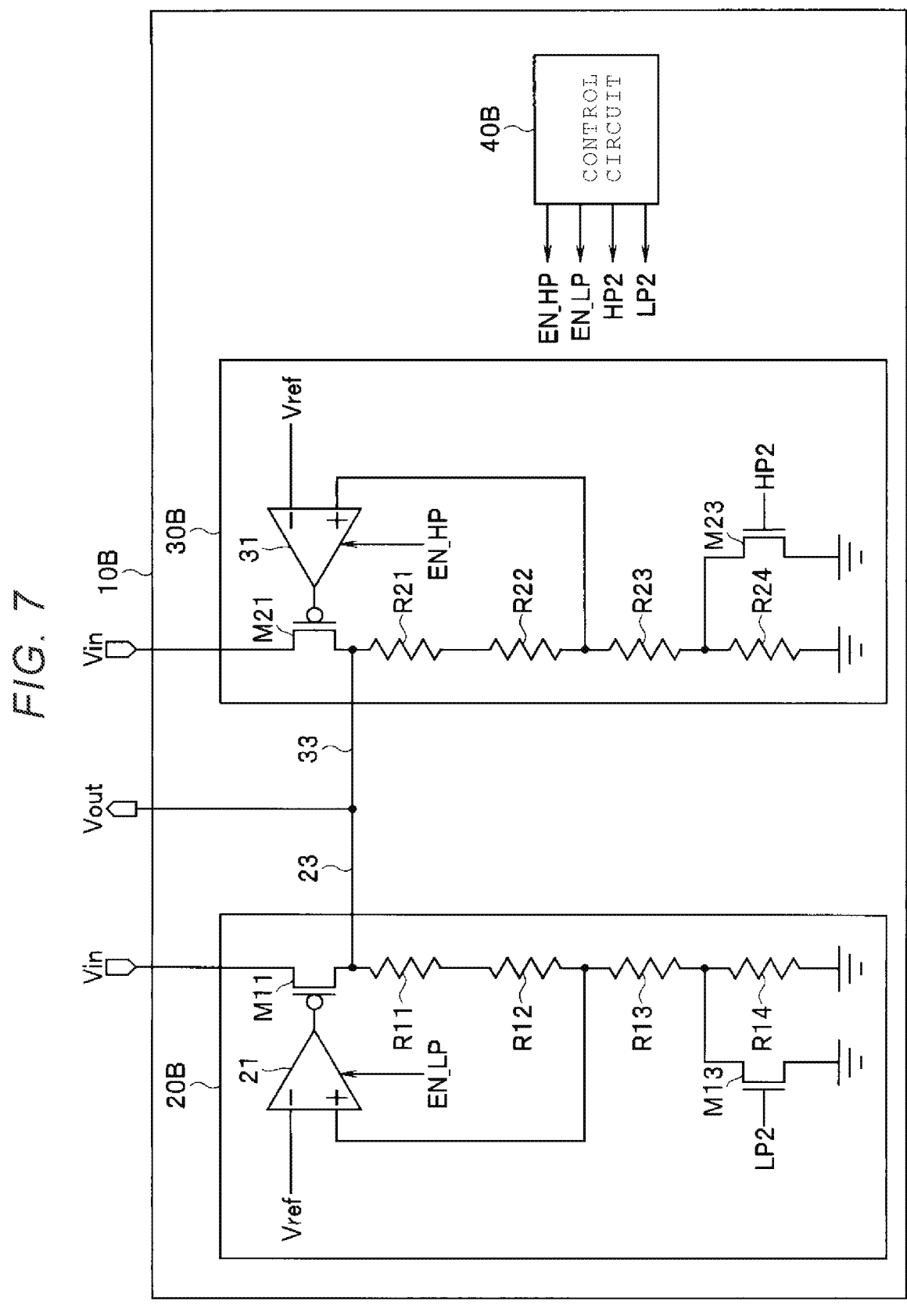
FIG. 7 is a circuit diagram illustrating an example of a configuration of a regulator circuit according to a second embodiment.

FIG. 7 is a circuit diagram illustrating an example of a configuration of a regulator circuit according to the second embodiment. In FIG. 7, the same configurations as in FIG. 4 are given the same reference numerals, and descriptions thereof are omitted.

A regulator circuit 10B according to the second embodiment includes a low power consumption regulator 20B, a fast response regulator 30B, and a control circuit 40B. The output terminal 23 of the low power consumption regulator 20B and the output terminal 33 of the fast response regulator 30B are connected to each other.

The low power consumption regulator 20B includes an NMOS transistor M13 instead of the NMOS transistor M12 of FIG. 4. The NMOS transistor M13 includes a drain terminal connected to the connection point between the resistors R13 and R14, a gate terminal to which a control signal LP2 is input, and a source terminal connected to the ground.

The fast response regulator 30B includes an NMOS transistor M23 instead of the NMOS transistor M22 of FIG. 4. The NMOS transistor M23 includes a drain terminal connected to the connection point between the resistors R23 and R24, a gate terminal to which a control signal HP2 is input, and a source terminal connected to the ground.

The control circuit 40B outputs the control signals LP2 and HP2 for controlling ON or OFF of the NMOS transistors M13 and M23 to the NMOS transistors M13 and M23, respectively. The NMOS transistor M13 is turned off when a low-level control signal LP2 is input and the NMOS transistor M13 is turned on when a high-level control signal LP2 is input. Similarly, the NMOS transistor M23 is turned off when a low-level control signal HP2 is input and the NMOS transistor M23 is turned on when a high-level control signal HP2 is input.

The control circuit 40B outputs the control signals LP2 and HP2 to turn off one of the NMOS transistors M13 and M23 during an overlap period when switching between the two regulators. The control circuit 40B outputs the control signals LP2 and HP2 so that both the NMOS transistors M13 and M23 are turned on in a period of time except for the overlap period when switching between the two regulators.

Specifically, the control circuit 40B outputs the low-level control signal LP2 to the NMOS transistor M13 in an overlap period when switching from the low power consumption regulator 20B to the fast response regulator 30B. The control circuit 40B outputs the high-level control signal LP2 to the NMOS transistor M13 in a period of time except for the overlap period when switching from the low power consumption regulator 20B to the fast response regulator 30B. Also, the control circuit 40B always outputs a high-level control signal HP2 to the NMOS transistor M23.

Meanwhile, the control circuit 40B outputs the low-level control signal HP2 to the NMOS transistor M23 in an overlap period when switching from the fast response regulator 30B to the low power consumption regulator 20B. The control circuit 40B outputs the high-level control signal HP2 to the NMOS transistor M23 in a period of time except for the overlap period when switching from the fast response regulator 30B to the low power consumption regulator 20B. Also, the control circuit 40B always outputs the high-level control signal LP2 to the NMOS transistor M13.

Figure 8:
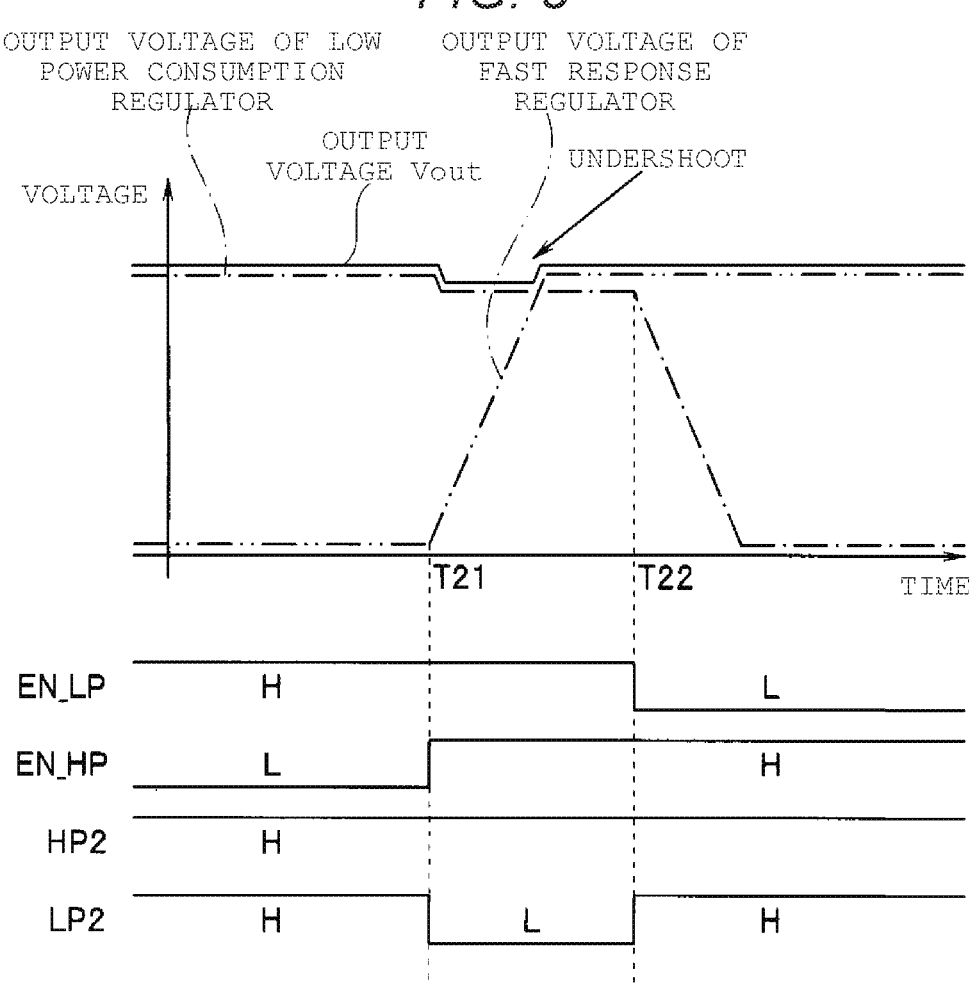
FIG. 8 is a timing chart illustrating a switching operation in the regulator circuit according to the second embodiment.

FIG. 8 is a timing chart illustrating a switching operation in the regulator circuit according to the second embodiment. FIG. 8 illustrates the operation of switching from the low power consumption regulator 20B to the fast response regulator 30B.

In a period of time before time T21, the control circuit 40B outputs a high-level control signal EN_LP and a low-level control signal EN_HP. As a result, the low power consumption regulator 20B is turned on and the fast response regulator 30B is turned off. Further, in the period of time before time T21, the control circuit 40B outputs the high-level control signal LP2 and the high-level control signal HP2. As a result, both the NMOS transistors M13 and M23 are turned on. When switching from the low power consumption regulator 20B to the fast response regulator 30B, the control circuit 40B raises a control signal EN_HP to a high level at time T21. As a result, the amplifier 31 starts operating, and the output voltage of the fast response regulator 30B rises.

Subsequently, the control circuit 40B causes a control signal EN_LP to fall to a low level at time T22. As a result, the amplifier 21 stops operating and an output voltage of the low power consumption regulator 20B falls.

Further, the control circuit 40B causes the control signal LP2 to fall in the overlap period during which the low power consumption regulator 20B and the fast response regulator 30B operate simultaneously, specifically, in a period of time from time T21 to time T22. When the low-level control signal LP2 is input to the gate terminal of the NMOS transistor M13, the NMOS transistor M13 is turned off, which causes the resistor R14 configuring a part of the first feedback resistor circuit to be conductive.

By causing the resistor R14 configuring a part of the first feedback resistor circuit to be conductive, the feedback voltage output from the connection point between the resistors R12 and R13 is increased than when the resistor R14 is short-circuited. Therefore, the amplifier 21 outputs a control signal for lowering the output voltage Vout to the gate terminal of the PMOS transistor M11.

As a result, an undershoot occurs in the output voltage of the low power consumption regulator 20B in the period of time from time T21 to time T22, and the output voltage Vout can be temporarily lowered. As a result, in the overlap period during which the low power consumption regulator 20B and the fast response regulator 30B operate simultaneously, the fast response regulator 30 with a high output voltage always maintains the output voltage Vout or higher.

Therefore, when the low power consumption regulator 20B is turned off, it is possible to switch from the low power consumption regulator 20B to the fast response regulator 30B without causing an undershoot in the output voltage Vout. Similar effects can be obtained by performing similar control when switching from the fast response regulator 30B to the low power consumption regulator 20B.

As described above, the regulator circuit 10B according to the second embodiment causes an undershoot in the output voltage of the previously operating regulator in the overlap period during which the low power consumption regulator 20B and the fast response regulator 30B operate simultaneously, so that the regulator that operates later maintains the output voltage Vout or higher. As a result, when switching between the low power consumption regulator 20B and the fast response regulator 30B, the regulator circuit 10B does not cause an undershoot in the output voltage Vout when the previously operating regulator is turned off.

Therefore, similarly to the first embodiment, the regulator circuit 10B can switch between the low power consumption regulator 20B and the fast response regulator 30B without significantly dropping the output voltage Vout.

The method of temporarily lowering the output voltage Vout of the previously operating regulator is not limited to changing a part of the resistors that configure the feedback resistor circuit from the short-circuited state to the conductive state. For example, as in the above-described modification, by using a switching circuit to change a position where the feedback voltage is output in the feedback resistor circuit, the output voltage Vout of the previously operating regulator may be temporarily lowered. Also, by making it possible to change an offset to the inverting input terminal or the non-inverting input terminal of the amplifiers 21 and 31, and by changing the offset to the inverting input terminal or the non-inverting input terminal of the amplifier 21 or 31 in the overlap period, the output voltage Vout of the previously operating regulator may be temporarily lowered.

Third Embodiment

Figure 9:
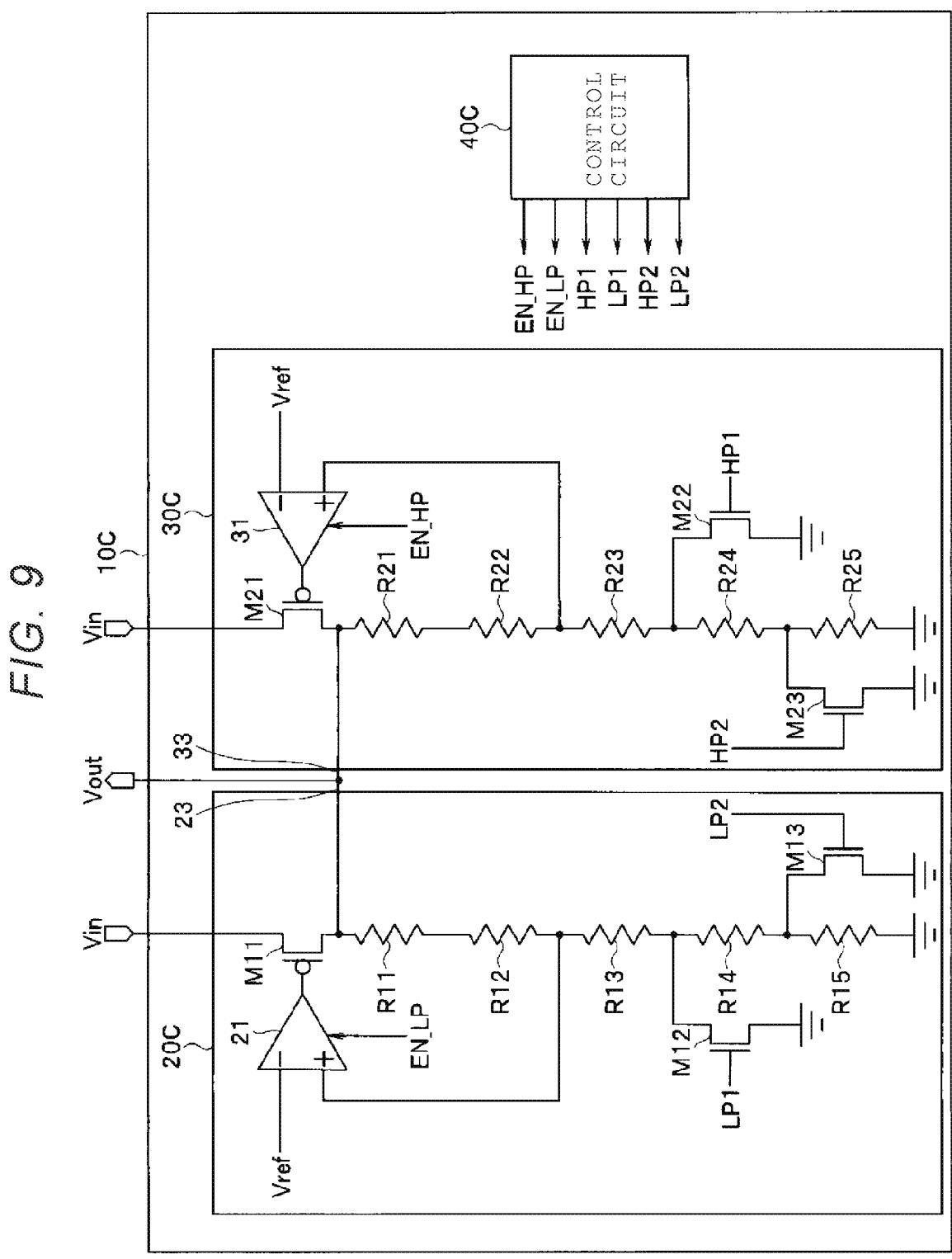
FIG. 9 is a circuit diagram illustrating an example of a configuration of a regulator circuit according to a third embodiment.

FIG. 9 is a circuit diagram illustrating an example of a configuration of a regulator circuit according to a third embodiment. In FIG. 9, the same configurations as in FIGS. 4 and 7 are given the same reference numerals, and descriptions thereof are omitted.

A regulator circuit 10C according to a third embodiment includes a low power consumption regulator 20C, a fast response regulator 30C, and a control circuit 40C. The output terminal 23 of the low power consumption regulator 20C and the output terminal 33 of the fast response regulator 30C are connected to each other.

The low power consumption regulator 20C includes a resistor R15 between the resistor R14 and the ground. A drain terminal of the NMOS transistor M13 is connected to a connection point between the resistors R14 and R15.

The fast response regulator 30C includes a resistor 25 between the resistor R24 and the ground. A drain terminal of the NMOS transistor M23 is connected to a connection point between the resistors R24 and R25.

In the third embodiment, the PMOS transistor M11, the NMOS transistor M12, and the NMOS transistor M13 are examples of a first transistor, a second transistor, and a third transistor, respectively. Also, the PMOS transistor M21, the NMOS transistor M22, and the NMOS transistor M23 are examples of a fourth transistor, a fifth transistor, and a sixth transistor, respectively.

The control circuit 40C outputs control signals LP1 and HP1 to the NMOS transistors M12 and M22, respectively, and outputs control signals LP2 and HP2 to the NMOS transistors M13 and M23, respectively.

The control circuit 40C outputs a high-level control signal HP1 to the NMOS transistor M22 in an overlap period when switching from the low power consumption regulator 20C to the fast response regulator 30C. The control circuit 40C outputs a low-level control signal HP1 to the NMOS transistor M22 in a period of time except for the overlap period when switching from the low power consumption regulator 20C to the fast response regulator 30C. Also, the control circuit 40C always outputs a low-level control signal LP1 to the NMOS transistor M12.

Further, the control circuit 40C outputs a low-level control signal LP2 to the NMOS transistor M13 in the overlap period when switching from the low power consumption regulator 20C to the fast response regulator 30C. The control circuit 40C outputs a high-level control signal LP2 to the NMOS transistor M13 in the period of time except for the overlap period when switching from the low power consumption regulator 20C to the fast response regulator 30C. Also, the control circuit 40C always outputs a high-level control signal HP2 to the NMOS transistor M23.

Meanwhile, the control circuit 40C outputs a high-level control signal LP1 to the NMOS transistor M12 in an overlap period when switching from the fast response regulator 30C to the low power consumption regulator 20C. The control circuit 40C outputs the low-level control signal LP1 to the NMOS transistor M12 in a period of time except for the overlap period when switching from the fast response regulator 30C to the low power consumption regulator 20C. Also, the control circuit 40C always outputs the low-level control signal HP1 to the NMOS transistor M22.

Also, the control circuit 40C outputs a low-level control signal HP2 to the NMOS transistor M23 in the overlap period when switching from the fast response regulator 30C to the low power consumption regulator 20C. The control circuit 40C outputs the high-level control signal HP2 to the NMOS transistor M23 in the period of time except for the overlap period when switching from the fast response regulator 30C to the low power consumption regulator 20C. Also, the control circuit 40C always outputs the high-level control signal LP2 to the NMOS transistor M13.

Figure 10:
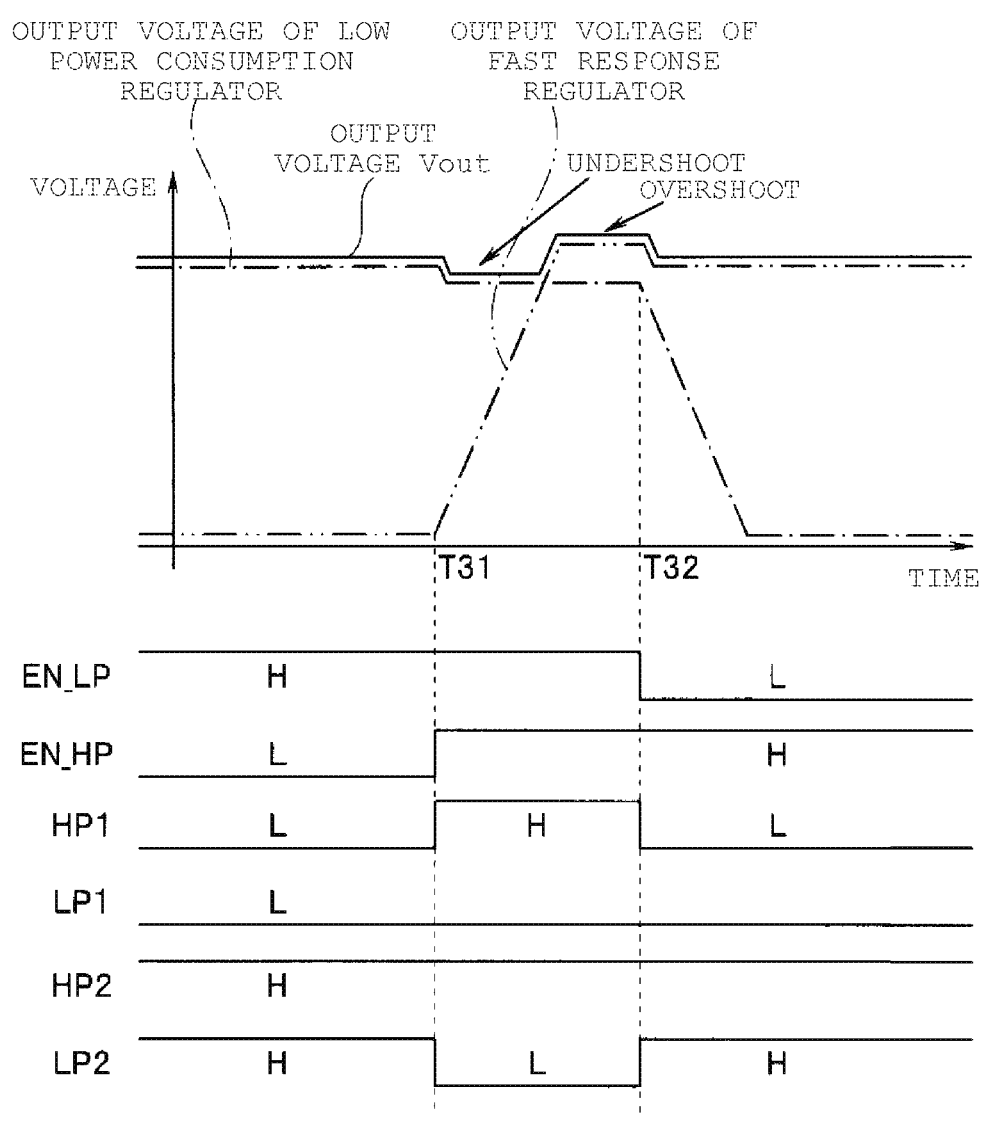
FIG. 10 is a timing chart illustrating a switching operation in the regulator circuit according to the third embodiment.

FIG. 10 is a timing chart illustrating a switching operation in the regulator circuit according to the third embodiment. FIG. 10 illustrates the operation of switching from the low power consumption regulator 20C to the fast response regulator 30C.

In a period of time before time T31, the control circuit 40C outputs a high-level control signal EN_LP and a low-level control signal EN_HP. As a result, the low power consumption regulator 20C is turned on and the fast response regulator 30C is turned off. Further, in the period of time before time T31, the control circuit 40C outputs the low-level control signal LP1 and the low-level control signal HP1. As a result, both the NMOS transistors M12 and M22 are turned off. Further, in the period before time T31, the control circuit 40C outputs the high-level control signal LP2 and the high-level control signal HP2. As a result, both the NMOS transistors M13 and M23 are turned on. When switching from the low power consumption regulator 20C to the fast response regulator 30C, the control circuit 40C raises the control signal EN_HP to a high level at time T31. As a result, the amplifier 31 starts operating, and an output voltage of the fast response regulator 30C rises.

Subsequently, the control circuit 40C lowers the control signal EN_LP to a low level at time T32. As a result, the amplifier 21 stops operating and an output voltage of the low power consumption regulator 20C falls.

Further, the control circuit 40C raises the control signal HP1 to a high level in the overlap period during which the low power consumption regulator 20C and the fast response regulator 30C operate simultaneously, specifically, in a period of time from time T31 to time T32. When the high-level control signal HP1 is input to the gate terminal of the NMOS transistor M22, the NMOS transistor M22 is turned on, which causes the resistors R24 and R25 configuring a part of the second feedback resistor circuit to be short-circuited.

By causing the resistors R24 and R25 configuring a part of the second feedback resistor circuit to be short-circuited, the feedback voltage output from the connection point between the resistors R22 and R23 is lowered than when the resistors R24 and R25 are not short-circuited. Therefore, the amplifier 31 outputs a control signal for increasing the output voltage Vout to the gate terminal of the PMOS transistor M21.

As a result, an overshoot occurs in the output voltage of the fast response regulator 30C in the period of time from time T31 to time T32, and the output voltage Vout can be temporarily increased.

Further, the control circuit 40C causes the control signal LP2 to fall in the overlap period during which the low power consumption regulator 20 and the fast response regulator 30 are operating simultaneously. When the low-level control signal LP2 is input to the gate terminal of the NMOS transistor M13, the NMOS transistor M13 is turned off, which causes the resistor R15 configuring a part of the first feedback resistor circuit to be conductive.

By causing the resistor R15 configuring a part of the first feedback resistor circuit to be conductive, the feedback voltage output from the connection point between the resistors R12 and R13 is increased than when the resistor R15 is short-circuited. Therefore, the amplifier 21 outputs a control signal for lowering the output voltage Vout to the gate terminal of the PMOS transistor M11.

As a result, an undershoot occurs in the output voltage of the low power consumption regulator 20C in the period of time from time T31 to time T32, and the output voltage Vout can be temporarily lowered. Similar effects can be obtained by performing similar control when switching from the fast response regulator 30C to the low power consumption regulator 20C.

As described above, the regulator circuit 10C according to the third embodiment causes an undershoot in the output voltage of the regulator operating first in the overlap period during which the low power consumption regulator 20C and the fast response regulator 30C operate simultaneously, and causes an overshoot in the output voltage of the regulator that operates later. As a result, the regulator circuit 10C allows the regulator that operates later to maintain the output voltage Vout or higher. As a result, when switching between the low power consumption regulator 20C and the fast response regulator 30C, the regulator circuit 10C does not cause an undershoot in the output voltage Vout when the previously operating regulator is turned off.

Therefore, similarly to the first embodiment, the regulator circuit 10C can switch between the low power consumption regulator 20C and the fast response regulator 30C without significantly dropping the output voltage Vout.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit comprising:
   a first regulator configured to output a first output voltage at a predetermined level from a first output terminal;
   a second regulator configured to output a second output voltage at the predetermined level from a second output terminal connected to the first output terminal; and
   a control circuit configured to:
       turn on the second regulator and then turn off the first regulator such that the first and second regulators both remain on for a certain period of time when a regulator to be used is switched from the first regulator to the second regulator; and
       during the certain period of time, cause the second output voltage of the second regulator to be increased to a level higher than the predetermined level.

2. The semiconductor integrated circuit according to claim 1, wherein
   the first regulator includes:
       a first transistor configured to output the first output voltage in response to a first control signal;
       a first feedback resistor circuit including a plurality of resistors connected in series, the first feedback resistor circuit configured to output a first feedback voltage corresponding to the first output voltage;
       a first amplifier configured to output the first control signal, which corresponds to a difference between the first feedback voltage and a reference voltage, to the first transistor; and
       a second transistor connected in parallel to a part of the plurality of resistors of the first feedback resistor circuit, and
   the second regulator includes:
       a third transistor configured to output the second output voltage in response to a second control signal;
       a second feedback resistor circuit including a plurality of resistors connected in series, the second feedback resistor circuit configured to output a second feedback voltage corresponding to the second output voltage;
       a second amplifier configured to output the second control signal, which corresponds to a difference between the second feedback voltage and the reference voltage, to the third transistor; and
       a fourth transistor connected in parallel to a part of the plurality of resistors of the second feedback resistor circuit.

3. The semiconductor integrated circuit according to claim 2, wherein the control circuit is configured to turn on the fourth transistor during the certain period of time and turn off the fourth transistor before and after the certain period of time.

4. The semiconductor integrated circuit according to claim 3, wherein the control circuit is configured to keep the second transistor turned off before, during, and after the certain period of time.

5. The semiconductor integrated circuit according to claim 1, wherein
   the first regulator includes:
       a first transistor configured to output the first output voltage in response to a first control signal;
       a first feedback resistor circuit including a plurality of resistors connected in series, the first feedback resistor circuit including a plurality of first nodes from a selected one of which a first feedback voltage corresponding to the first output voltage is output;
       a first amplifier configured to output the first control signal, which corresponds to a difference between the first feedback voltage and a reference voltage, to the first transistor; and
       a first switching circuit configured to select one of the first nodes from which the first feedback voltage is output, and
   the second regulator includes:
       a third transistor configured to output the second output voltage in response to a second control signal;
       a second feedback resistor circuit including a plurality of resistors connected in series, the second feedback resistor circuit including a plurality of second nodes from a selected one of which a second feedback voltage corresponding to the second output voltage is output;
       a second amplifier configured to output the second control signal, which corresponds to a difference between the second feedback voltage and the reference voltage to the third transistor; and
       a second switching circuit configured to select one of the second nodes from which the second feedback voltage is output.

6. The semiconductor integrated circuit according to claim 5, wherein the control circuit is configured to control the second switching circuit to electrically connect a first one of the second nodes at a first voltage level to the second amplifier during the certain period of time, and electrically connect a second one of the second nodes at a second voltage level higher than the first voltage level to the amplifier before and after the certain period of time.

7. The semiconductor integrated circuit according to claim 1, wherein the control circuit is configured to, during the certain period of time, cause the first output voltage of the first regulator to decrease to a level lower than the predetermined level.

8. The semiconductor integrated circuit according to claim 7, wherein
   the first regulator includes:
       a first transistor configured to output the first output voltage in response to a first control signal;
       a first feedback resistor circuit including a plurality of resistors connected in series, the first feedback resistor circuit configured to output a first feedback voltage corresponding to the first output voltage;
       a first amplifier configured to output the first control signal, which corresponds to a difference between the first feedback voltage and a reference voltage, to the first transistor;
       a second transistor connected in parallel to a part of the plurality of resistors of the first feedback resistor circuit; and
       a third transistor connected in parallel to at least one of the part of the plurality of resistors of the first feedback resistor circuit, and
   the second regulator includes:
       a fourth transistor configured to output the second output voltage in response to a second control signal;
       a second feedback resistor circuit including a plurality of resistors connected in series, the second feedback resistor circuit configured to output a second feedback voltage corresponding to the second output voltage;

a second amplifier configured to output the second control signal, which corresponds to a difference between the second feedback voltage and the reference voltage, to the third transistor;

a fifth transistor connected in parallel to a part of the plurality of resistors of the second feedback resistor circuit; and a sixth transistor connected in parallel to at least one of the part of the plurality of resistors of the second feedback resistor circuit.

9. The semiconductor integrated circuit according to claim 8, wherein the control circuit is configured to turn off the third transistor during the certain period of time and turn on the third transistor before and after the certain period of time, and turn on the fifth transistor during the certain period of time and turn off the fifth transistor before and after the certain period of time.

10. The semiconductor integrated circuit according to claim 9, wherein the control circuit is configured to keep the second transistor turned off before, during, and after the certain period of time, and keep the sixth transistor turned on before, during, and after the certain period of time.

11. The semiconductor integrated circuit according to claim 1, wherein a power consumption of the first regulator is less than that of the second regulator, and a response speed of the first regulator is less than that of the second regulator.

12. The semiconductor integrated circuit according to claim 1, wherein a power consumption of the first regulator is greater than that of the second regulator, and a response speed of the first regulator is greater than that of the second regulator.

13. A semiconductor device comprising:

the semiconductor integrated circuit according to claim 1; and a load circuit configured to operate with an output voltage output from the semiconductor integrated circuit.

14. A memory system comprising:

the semiconductor device according to claim 13; and a semiconductor memory device connected to the semiconductor device and configured to store data under control of the semiconductor device.

15. A semiconductor integrated circuit comprising:

a first regulator configured to output a first output voltage at a predetermined level from a first output terminal;

a second regulator configured to output a second output voltage at the predetermined level from a second output terminal connected to the first output terminal; and a control circuit configured to:

turn on the second regulator and then turn off the first regulator such that the first and second regulators both remain on for a certain period of time when a regulator to be used is switched from the first regulator to the second regulator; and during the certain period of time, cause the second output voltage of the second regulator to be decreased to a level lower than the predetermined level.

16. The semiconductor integrated circuit according to claim 15, wherein the first regulator includes:

a first transistor configured to output the first output voltage in response to a first control signal;

a first feedback resistor circuit including a plurality of resistors connected in series, the first feedback resistor circuit configured to output a first feedback voltage corresponding to the first output voltage;

a first amplifier configured to output the first control signal, which corresponds to a difference between the first feedback voltage and a reference voltage, to the first transistor; and a second transistor connected in parallel to a part of the plurality of resistors of the first feedback resistor circuit, and the second regulator includes:

a third transistor configured to output the second output voltage in response to a second control signal;

a second feedback resistor circuit including a plurality of resistors connected in series, the second feedback resistor circuit configured to output a second feedback voltage corresponding to the second output voltage;

a second amplifier configured to output the second control signal, which corresponds to a difference between the second feedback voltage and the reference voltage, to the third transistor; and a fourth transistor connected in parallel to a part of the plurality of resistors of the second feedback resistor circuit.

17. The semiconductor integrated circuit according to claim 16, wherein the control circuit is configured to turn off the second transistor during the certain period of time and turn on the second transistor before and after the certain period of time.

18. The semiconductor integrated circuit according to claim 17, wherein the control circuit is configured to keep the fourth transistor turned on before, during, and after the certain period of time.

19. A semiconductor device comprising:

the semiconductor integrated circuit according to claim 15; and a load circuit configured to operate with an output voltage output from the semiconductor integrated circuit.

20. A memory system comprising:

the semiconductor device according to claim 19; and a semiconductor memory device connected to the semiconductor device and configured to store data under control of the semiconductor device.

* * * * *